United States Patent [19]
Shimura

[11] Patent Number: 5,138,240
[45] Date of Patent: Aug. 11, 1992

[54] HORIZONTAL-DEFLECTION DRIVING CIRCUIT

[75] Inventor: Tatsuhisa Shimura, Fujisawa, Japan

[73] Assignee: Matsushita Electric Industrial Co., Ltd., Kadoma, Japan

[21] Appl. No.: 702,909

[22] Filed: May 21, 1991

[30] Foreign Application Priority Data

May 24, 1990 [JP] Japan ................... 2-135016

[51] Int. Cl.$^5$ .................... G09G 1/04; H01J 29/70
[52] U.S. Cl. ........................................ 315/408
[58] Field of Search .................. 315/408, 409, 364

[56] References Cited

FOREIGN PATENT DOCUMENTS 0043872 4/1981 Japan ........................ 315/408
2186138 8/1987 United Kingdom ......... 315/408

*Primary Examiner*—Gregory C. Issing
*Attorney, Agent, or Firm*—Cushman, Darby & Cushman

[57] ABSTRACT

In order to supply a constant base current to a horizontal-deflection output transistor for driving a horizontal-deflection circuit, a current source circuit for supplying a constant current and an impedance element circuit are both connected to the base of the transistor via a voltage source circuit. The current source circuit and the impedance element circuit are alternately switched on (or off) by receiving drive pulses.

4 Claims, 9 Drawing Sheets

HORIZONTAL-DEFLECTION DRIVING CIRCUIT

FIELD OF THE INVENTION AND RELATED ART STATEMENT

1. FIELD OF THE INVENTION

The present invention relates to a horizontal-deflection driving circuit to be employed in a cathode ray tube display, which is used as an output apparatus of a computer, or a TV set, and more particularly relates to the horizontal-deflection driving circuit in the cathode ray tube display of the TV set which has a system that the free running frequency is changeable in compliance with a horizontal synchronizing signal inputted thereto.

2. DESCRIPTION OF THE RELATED ART

In recent years, demand for a cathode ray tube display employing a system that the free running frequency is changeable has gradually increased, because such a cathod ray tube display is applicable to several picture signals of computers. In the above-mentioned system (hereinafter referred to as a multiscan system), the free running frequency is changed in compliance with the horizontal synchronizing signal, input to the cathode ray tube display. As concerns the TV set too, demand for employment of the multiscan system has increased. This is because the recent TV set is used not only for receiving TV signal having a horizontal deflection frequency of 15.75 kiloherz (generally used) but also for receiving output signals from a microcomputer device generally having a horizontal frequency of 20-70 kiloherz.

FIG. 6 is a circuit diagram showing an example of the conventional horizontal-deflection driving circuit. This is disclosed on page 177–page 182 of NHK COLOR TV KYOKASHO (textbook) Vol. 1 edited by NIPPON HOSO KYOKAI. In FIG. 6, the primary winding of a horizontal drive transformer 18 is connected to a horizontal drive power source 7 via a horizontal drive transistor 10. The secondary winding of the horizontal drive transistor 10 is connected to a horizontal output transistor 6. A horizontal deflection drive pulse (hereinafter referred to as a drive pulse) is applied to the base of the horizontal drive transistor 10. By the horizontal drive transformer 18, impedance conversion is executed for the drive pulse so as to drive the horizontal output transistor 6.

Hereupon, the waveform of the base current of the horizontal output transistor 6 has a great influence over its power loss. FIGS. 7a, 7b and 7c are graphs each showing waveforms of the collector voltage of the horizontal drive transistor 10 and the resultant base current of the horizontal output transistor 6. Waveforms A1, B1 and C1 represent the collector voltages of the horizontal drive transistor 10, and waveforms A2, B2 and C2 represent the base current of the horizontal output transistor 6. Power loss of the horizontal output transistor 6 is greatly influenced by an $I_{b-end}$ which is a value of the base current of the horizontal output transistor 6 within a predetermined time range. For example, when a value of $I_{b-end}$ is lower than a proper value, a saturation voltage of the horizontal output transistor 6 increases, thereby causing increase of the power loss. When a value of $I_{b-end}$ is higher than the proper value, a storage time peculiar to the bipolar transistor increases, thereby causing increase of the power loss, too. From many experiments, it has been known to one of ordinary skill in the art that the $I_{b-end}$ has a constant value independent of the horizontal deflection frequency when only a deflection current is constant. In order to fix a value of $I_{b-end}$, two methods have been employed in the prior art.

One of these methods is as follows:

(1) By controlling a duty of drive pulse to be constant independent of the horizontal deflection frequencey, a value of $I_{b-end}$ generally decreases in response to decrease of frequency, due to a frequency characteristic of the horizontal drive transformer 18. In order to compensate this decrease, another circuit for detecting the horizontal deflection frequency is provide, and the voltage source 7 of variable voltage is provided, thereby making the $I_{b-end}$ constant.

The other method is as follows:

(2) As shown in FIGS. 7a, 7b and 7c, a value of $I_{b-end}$ increases when an on-period of the horizontal drive transistor 10 is lengthened. To lengthen the on-period of the horizontal drive transistor 10 is equivalent to shortening a period within which the base current flows. Based on the horizontal deflection frequency detected by another circuit, duty of the drive pulse is controlled, thereby holding the $I_{b-end}$ constant.

However, the above-mentioned two methods have the following shortcomings:

First, it is necessary for constructions of both methods to provide another circuit for detecting the horizontal deflection frequency and giving a predetermined control. Since electronic components generally have uneven electric characteristics, operating accuracy of a complicated circuit will inevitably be low. It is therefore necessary for the complicated circuit to use high-precision electronic components. However, these high-precision electronic components are expensive. The further the circuit is complicated, the more expensive the circuit becomes.

Next, in the construction based on the above-mentioned method (1), when a voltage of the voltage source 7 is fixed, change of the $I_{b-end}$ caused by change of the horizontal deflection frequency is large. In order to fix the $I_{b-end}$, the voltage source 7 is required to have a wide variable range of voltage. Since the power required for the horizontal driving is normally 2–3 watt, securing of the wide variable range of the voltage source 7 causes undesirable increase of power loss in the voltage source 7.

Further, shortcomings in the above-mentioned method (2) is described with reference to FIGS. 8a, 8b, 8c, 9a, 9b and 9c. FIG. 8a is a graph showing a waveform of the collector voltage A of the horizontal drive transistor 10, and FIG. 8b is a graph showing a waveform of the base current B of the horizontal output transistor 6. FIGS. 8c shows waveforms of the collector current C and the collectgor voltage D of the horizontal output transistor 6. FIGS. 9a, 9b and 9c are similar graphs to FIGS. 8a, 8b and 8c, respeceively, except that frequencies are different from each other.

In FIG. 8b or FIG. 9b, it is experimentally known that a storage time $T_{stg}$, which is peculiar to the bipolar transistor, is substantially constant independent of the horizontal frequency. A ratio of the storage time $T_{stg}$ to one period is small and a frequency is low in FIG. 8b, whereas the ratio is large and the frequency is high in FIG. 9b.

In the case where the frequency is low as shown in FIG. 8b, according to the construction based on the method (2), duty is controlled in order to compensate for decrease in the $I_{b-end}$, thereby shortening an on-period (positive parts of the waveforms B in FIG. 8b) of the base current of the horizontal output transistor 6. To shorten the on-period as mentioned above is hereinafter referred to as "to shorten the duty". However, when the duty is shortened, a cross-tolerance $T_c$ defined in FIG. 8c decreases, thereby causing a decline of linearity of picture in the horizontal direction. As a result, there exists a high possibility that a vertical line appears in a picture.

In case where the frequency is high as shown in FIG. 9b, control of duty is executed so that the on-period (positive parts of the waveform B in FIG. 9b) of the base current of the horizontal output transistor 6 is lengthened. To lengthen the on-period as mentioned above is hereinafter referred to as "to lengthen the duty". Since the ratio of the storage time $T_{stg}$ to one period is large at the time of high frequency, the on-period of the collector current of the horizontal output transistor 6 is lengthened relatively (against one period) in comparison with the case of low freuency. Therefore, an on-tolerance $T_{on}$ defined in FIG. 9c decreases. When the duty is lengthened further, the on-tolerance $T_{on}$ vanishes. Since the horizontal output transistor 6 is thereby turned on during a time period when the collector voltage D is being generated, the power flowing through the horizontal output transistor 6 increases. As a result, the horizontal output transistor 6 may reach the worst situaton, namely thermal breakdown.

As mentioned above, since the duty has a considerable influence on performance and reliability, it is a delicated operation to change the duty of the drive pulse.

OBJECT AND SUMMARY OF THE INVENTION

An object of the present invention is to offer a horizontal-deflection driving circuit capable of supplying a constant $I_{b-end}$, which is independent of horizontal frequency and duty, without any horizontal frequency detection circuit.

In order to achieve the above-mentioned object, the horizontal-deflection driving circuit of the present invention comprises:

a horizontal-deflection output transistor of bipolar;

a voltage source circuit whose negative terminal is connected to the base of the horizontal-deflection output transistor;

a current source circuit whose output terminal is connected to a positive terminal of the voltage source circuit, the current source circuit having alternative e activated state and deactivated state;

an impedance element circuit, a first terminal of which is connected to the positive terminal of the voltage source circuit and a second terminal of which is connected to the earth, the impedance element circuit having alternative activated state and deactivated state; and a drive pulse supply circuit for selecting the deactivated state of the impedance element circuit when the current source circuit is in the activated state and for selecting the activated state of the impedance element circuit when the current source circuit is in the deactivated state.

In the above-mentioned horizontal-deflection driving circuit, base current having always proper value independent of horizontal deflection frequency and duty is supplied to the horizontal-deflection output transistor.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 2a, 2b and 2c are graphs each showing a waveform of driven pulse having a predetermined duty and a waveform of base current in the circuit of FIG. 1a.

DESCRIPTION OF THE PREFERRED EMBODIMENT

Hereafer, preferred embodiments of the present invention are described with reference to the accompanying drawings.

Figure 1A:
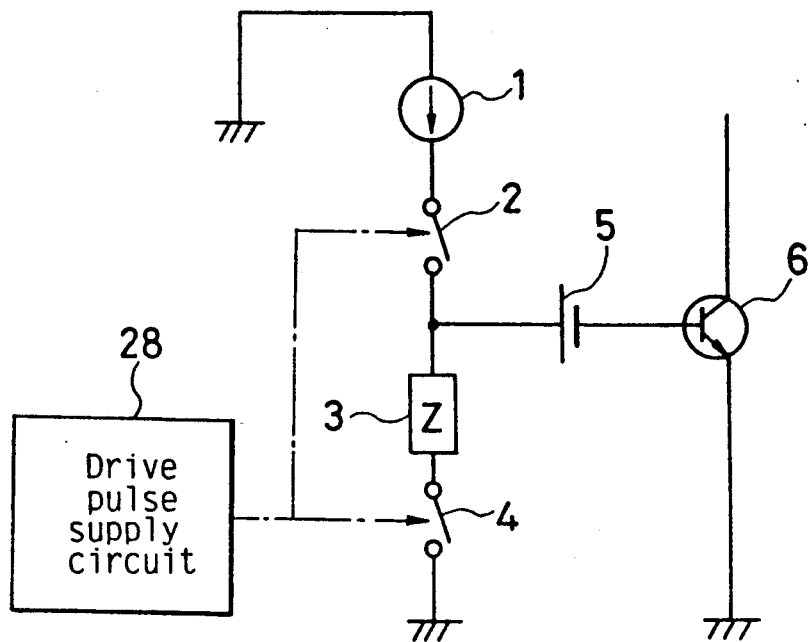
FIG. 1a is a circuit diagram showing a basic horizontal-deflection driving circuit of the present invention.
Figure 1B:
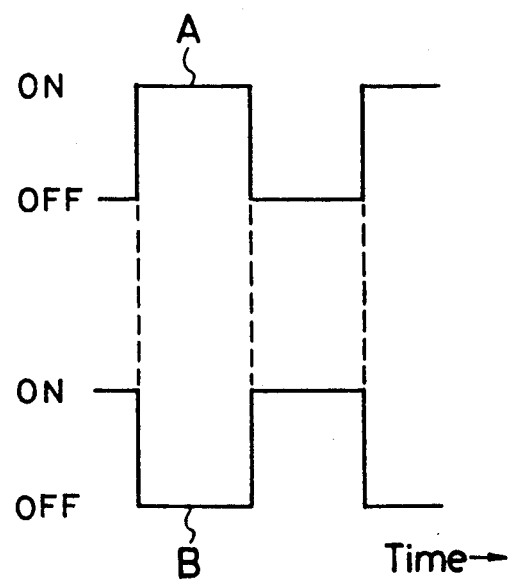
FIG. 1b is a graph showing voltage waveforms A and B given to switches 2 and 4 in FIG. 1a, respectively.

FIG. 1a is a circuit diagram showing a basic horizontal-deflection driving circuit. A horizontal deflection circuit (not shown) is provided after this circuit. A current source 1 and a switch 2 are connected in seres with each other, and they are provided between the positive terminal of a voltage source 5 and the earth. An impedance element 3 and a switch 4 are also connected is series with each other, and they are provided between the postive terminal of the voltage source 5 and the earth. The current source 1 and the inmpedance element 3 are activated/deactivated by closing/opening the switches 2 and 4, respectively. Closing/opening of the switches 2 and 4 are carried out in accordance with control signals (drive pulse) having waveforms A and B shown in FIG. 1b, respectively. These control signals are supplied by a drive pulse supply circuit 28. The voltage source 5 is provided in order to apply a negative voltage to the base of a horizontal output transistor 6 at the time when the switch 4 is turned on. This negative voltage serves to accelerate an absorption speed of stored charge in the horizontal output transistor 6.

Next, operartion of the above-mentioned horizontal-deflection driving circuit is described.

Figure 2A:
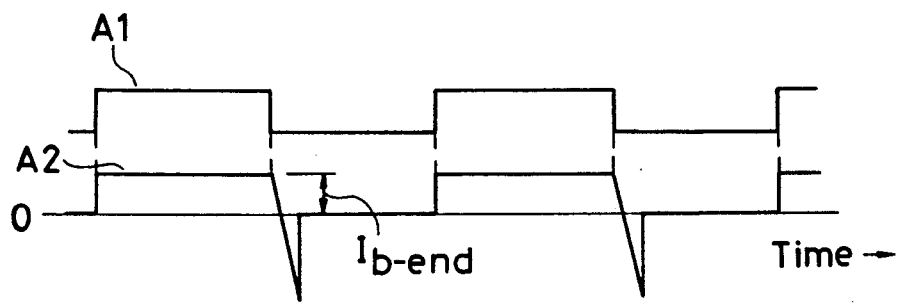
Figure 2B:
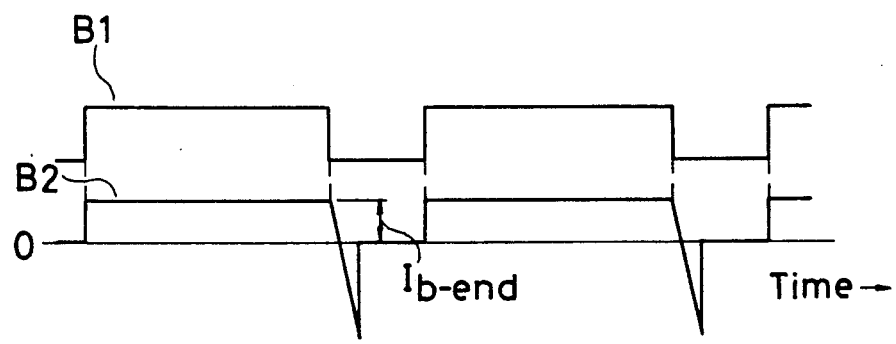
Figure 2C:
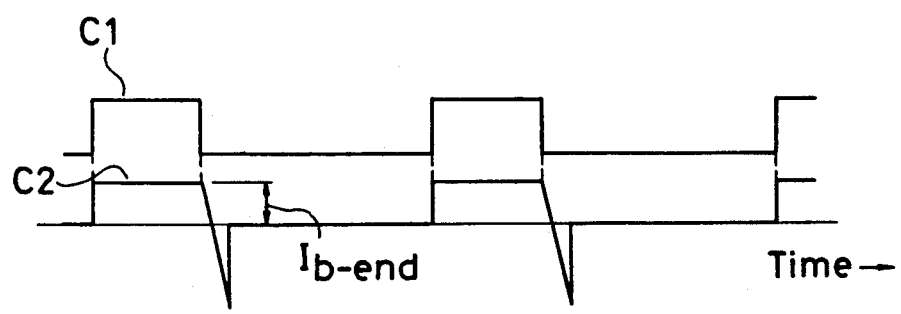

FIGS. 2a, 2b and 2c are graphs each showing a waveform of drive pulse A1, B1 or C1 and a waveform of the base current A2, B2 C2 of the horizontal output transistor 6. Duties of three drive pulses A1, B1 and C1 are different from each other.

In FIG. 1a, when the swithch 2 is closed and the switch 4 is opened, current of the current source 1 flows in the base of the horizontal output transistor 6 through the voltage source 5. This current flowing in the base is of constant value given by the current source 1. Thereafter, the switch 2 is opened at a predetermined time defined by the drive pulse, and the switch 4 is closed at the same time. At that time, the positive terminal of the voltage source 5 is grounded via the impedance element 3, and the base of the horizontal output transistor 6 is thereby biased negative. The charge stored in the base of the horizontal output transistor 6 is discharged via the voltage source 5, the impedance element 3 and the switch 4. Owing to presence of the current source 1, even when the duty of the drive pulse has changed as shown in FIGS. 2a, 2b and 2c, the value of $I_{b-end}$ is always constant.

Figure 3:
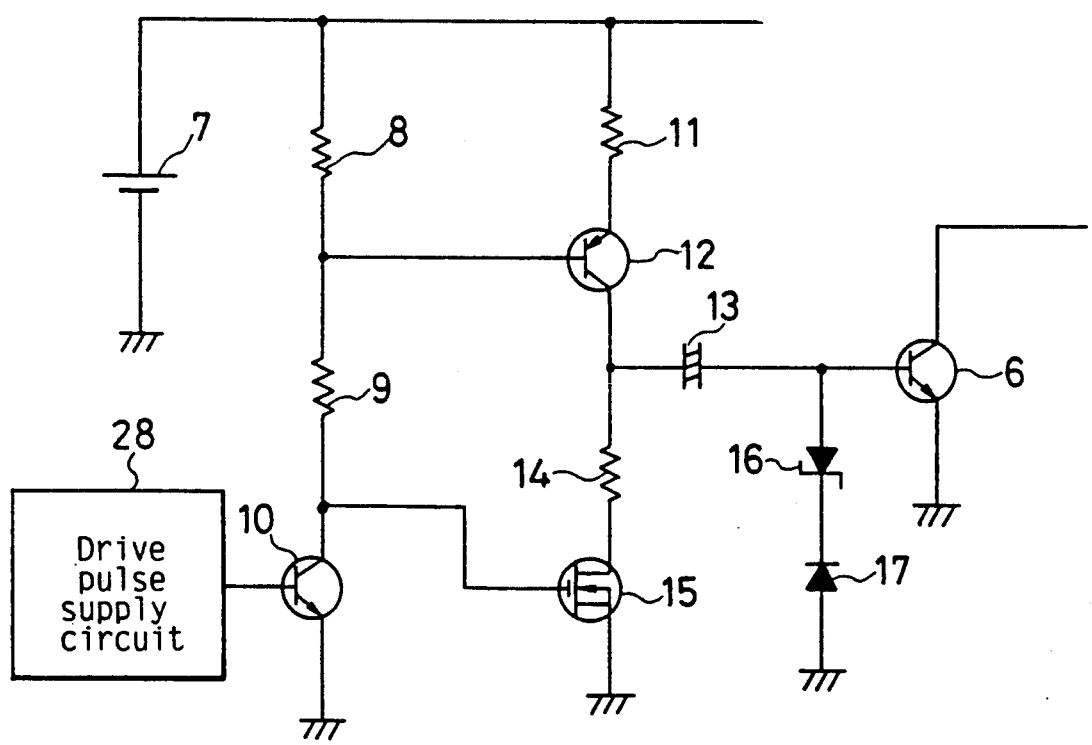
FIG. 3 is a circuit diagram shwoing a concrete example of a horizontal-deflection driving circuit as a first embodiment of the preseent invention.

FIG. 3 is a concrete circuit diagram showing a first embodiment of the horizontal-deflection driving circuit. In FIG. 3, a voltage source 7, transistors 10, 12 and resistors 8, 9, 11 constitute a current source utilizing a self-bias circuit including a transistor. When the transistor 10 is switched on by receiving a drive pulse from the drive pulse supply circuit 28, a bias voltage, which is obtained by dividing the voltage of the voltage source 7 with the resistors 8 and 9, is given to the transistor 12. The transistor 12 is thereby switched on, and a current limited by the resistor 11 is supplied to the base of the horizontal output transistor 6 through the capacitor 13. The capacitor 13 is thereby charged by the current flowing therethrough, and a voltage of the capacitor 13 increases.

When the transistor 10 is switched off, the base-bias for the transistor 12 is lost. Accordingly, the transistor 12 is turned to the cut-off state, and supply of the base current for the transistor 6 ceases. Instead, the voltage of the voltage source 7 is applied to the gate of an FET (Field Effect Transistor) 15 via the resistors 8 and 9, and an electrical conduction is formed between the source and the drain of the FET 15. The collector of the transistor 12 is thereby grounded via a resistor 14. As a result, the base of the transistor 6 is biased negative through a voltage charged in the capacitor 13, and thereby the stored charge runs out from the transistor 6. At the same time, the negative bias of the base of the transistor 6 is clamped (held) at a voltage which is a sum of the zener voltage of the zener diode 16 and the forward directional voltage of the diode 17. Thus, a holding voltage of the capacitor 13 is always kept constant in substance just like a voltage source. The diode 17 is provided in order to avoid branching of the base current which is caused by the forward directional current of the zener diode 16 during a time period for supplying the base current to the horizontal output transistor 6.

Figure 4:
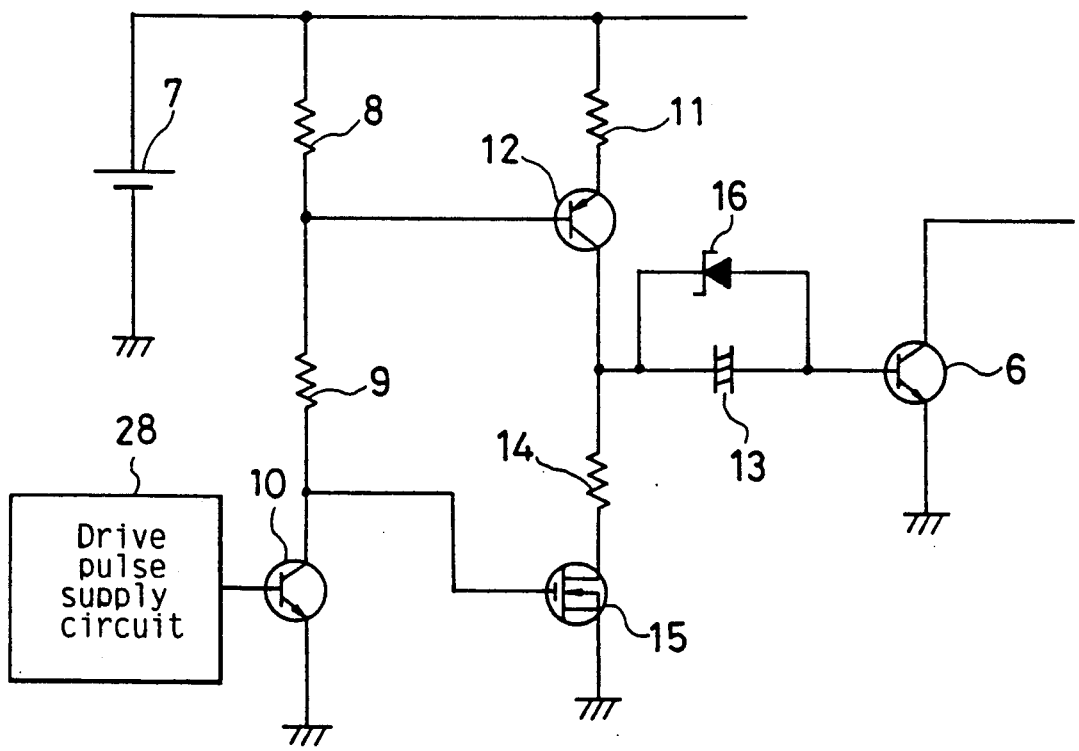
FIG. 4 is a circuit diagram showing a concrete example of a horizontal-deflection driving circuit as a second embodiment of the present invention.

FIG. 4 is a concrete circuit diagram showing a second embodiment. Corresponding components to the first embodiment are shown by the same numerals, and the description thereon made in the first embodiment similarly applies. Differences and features of this second embodiment from the first embodiment are as follows.

The zener diode 16 is connected in parallel with the capacitor 13 with its anode connected to the base of the horzontal output thansistor 6. Operation of this circuit is similar to that of the first embodiment except its clamp method of the capacitor 13. In the first embodiment (FIG. 3), the capaitor 13 is clampled when the FET 15 on-state. In this second embodiment (FIG. 4), however, the capacitor 13 is always clamped with the zener voltage of the zener diode 16, thereby serving as a voltage soource.

Figure 5:
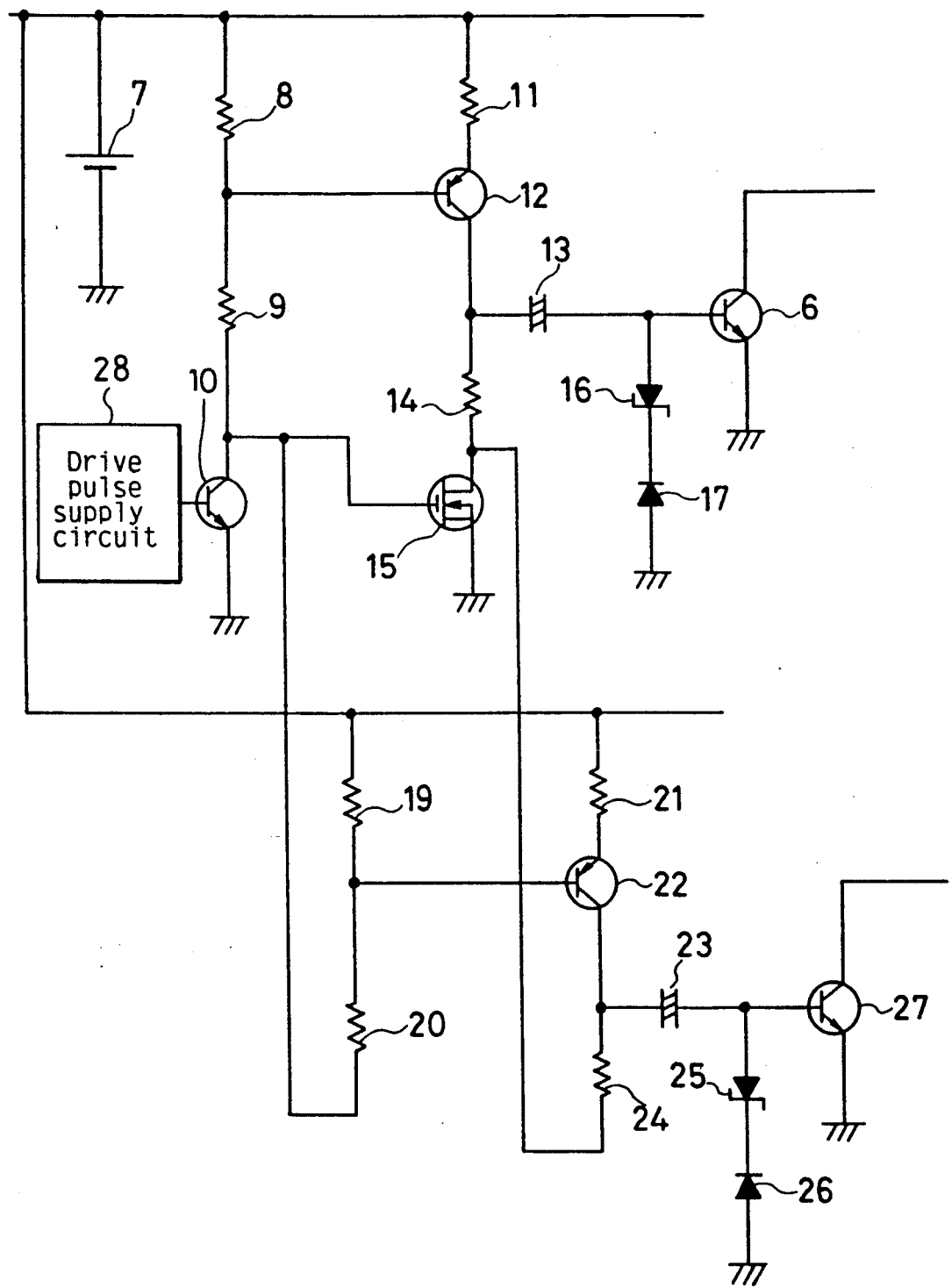
FIG. 5 is circuit diagram showing a concrete example of a horizontal-deflection driving circuit as a third embodiment of the present invention.
Figure 6:
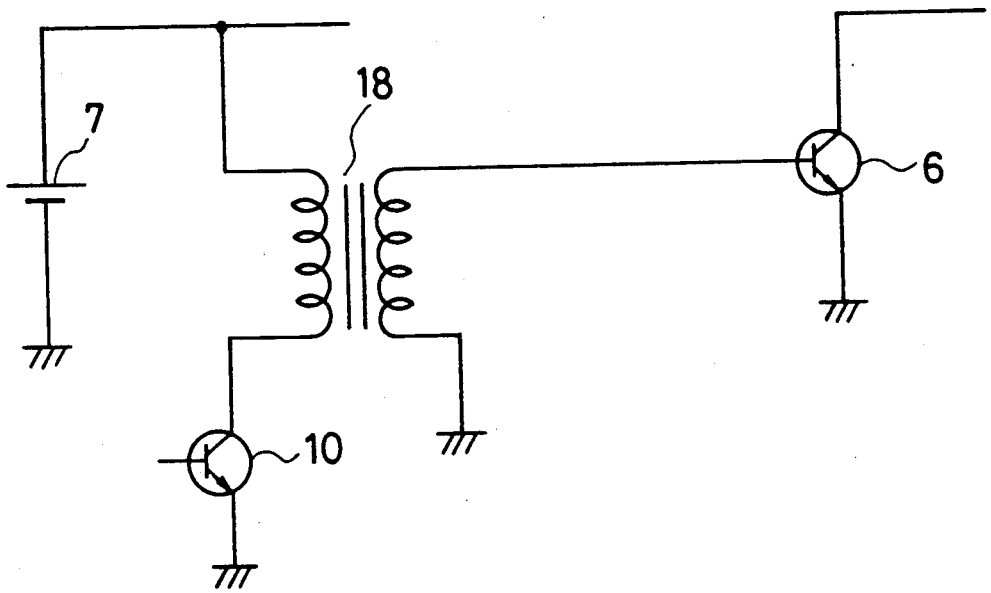
FIG. 6 is a circuit diagram showing an example of the conventional horizontal-defection driving circuit.
Figure 7A:
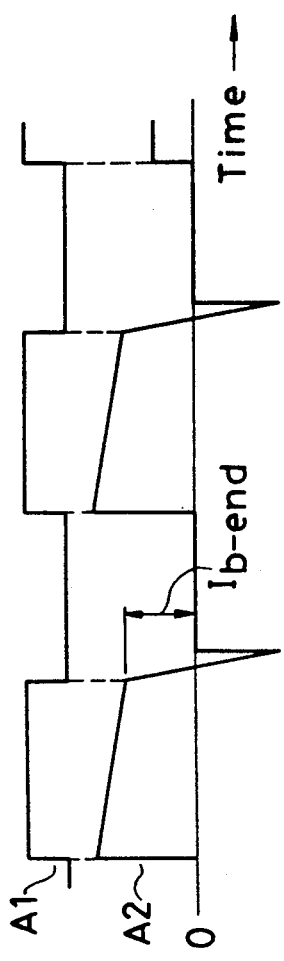
FIG. 7a, 7b and 7c are graphs each showing a waveform of drive pulse having a predetermined duty and a wave of base current in the circuit of FIG. 6.
Figure 7B:
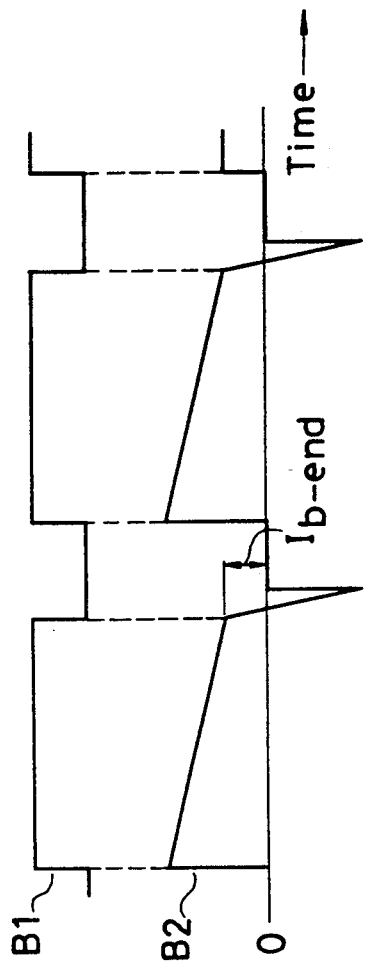
Figure 7C:
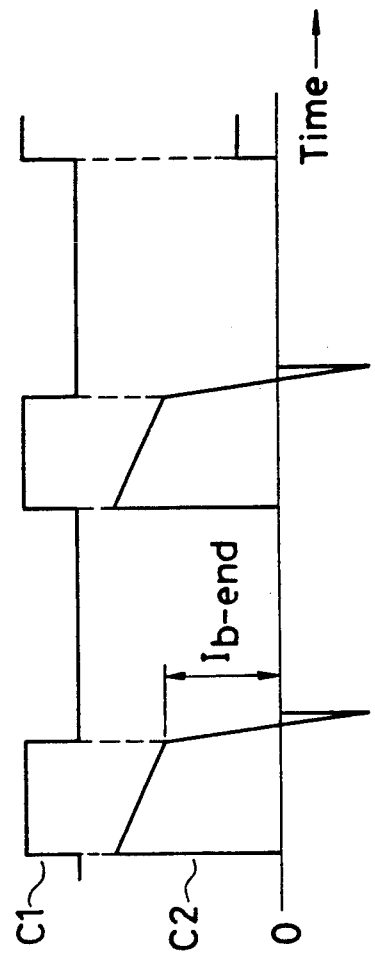
Figure 8A:
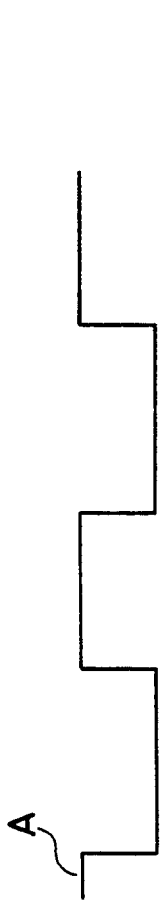
FIG. 8a is a graph showing a waveform of the collector voltage A of a horizontal drive transistor 10 shown in FIG. 6.
Figure 8B:
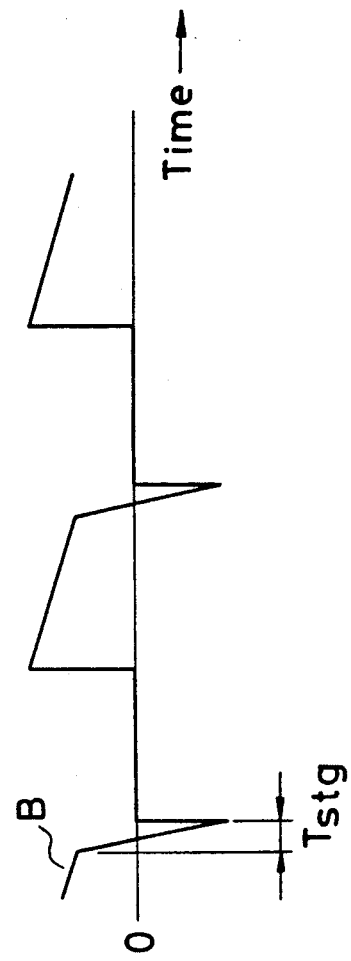
FIG. 8b is a graph showing a waveform of the base current B of a horizontal output transistor 6 shown in FIG. 6.
Figure 8C:
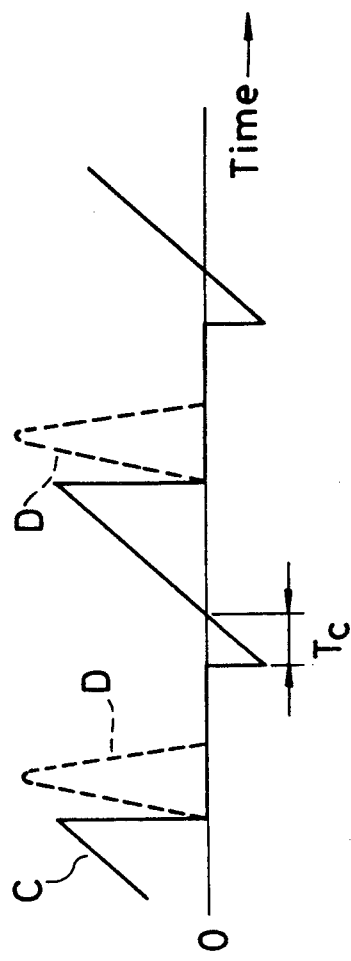
FIG. 8c is a graph showing waveforms of the collector current C and the collector voltage D of the horizontal output transistor 6 shown in FIG. 6.
Figure 9A:
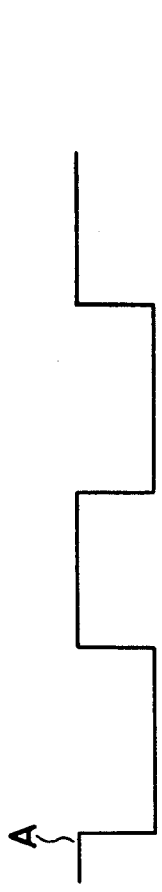
FIGS. 9a, 9b and 9c are similar graphs to FIGS. 8a, 8b and 8c, respectively except that frequencies are different from each other.
Figure 9B:
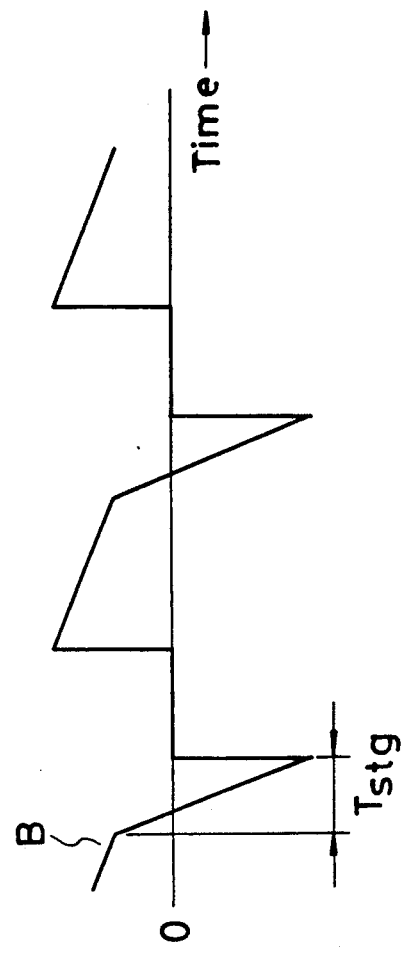
Figure 9C:
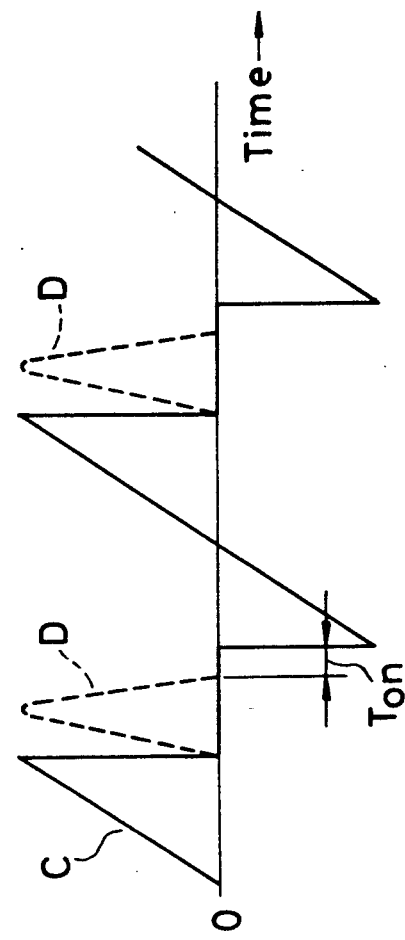

FIG. 5 is a concrete circuit diaram showing a third embodiment. Corresponding components to the first embodiment are shown by the same numerals, and the description thereon made in the first embodiment similarly applies. An upper part og FIG. 5 including the components 6–17 and 28 is the same as FIG. 3. Components 19–27 included in a lower part of FIG. 5 have similar functions to thed components 8, 9, 11–14, 16, 17 and 6 in the upper part, respectively. Only the voltage source 7, the transistor 10 and the FET 15 are used in common. This circuit is mainly used for a cathode ray tube display of extra high resolution. A transistor 27, which is for generating a high voltage required for driving the cathode ray tube, is switched on simultaneously with switching-on of the horizontal output transistor 6. In the ordinary TV set or the cathode ray tube of low or medium resolution, the horizontal deflection and the high voltage generation are both controlled only by one transistor. However, since the cathode ray tube display of extra high resolution is easily influenced by fluctuation of the picture which is caused by change of liminance, it is general that the horizontal deflection and the high voltage generation are separately executed by respective output transistors.

In FIG. 5, since opeation of the upper part (components 6–15 and 28) of the circuit is similar to that of the first embodiment (FIG. 3) the description thereon made in the first embodiment similarly applies.

Resistors 19, 20, 21 and a transistor 22 constitute a current source and supply a base current to the transistor 27 via a capacitor 23 at an on-state of the transistor 10. When the transistor 10 is swithed off, the charge stored in the base of the transistor 27 is discharged through a resistor 24 and the FET 15. The capacitor 23 is clampled by a zener diode 25 and a diode 26 in the similar way that to the first embodiment.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A horizontal-deflection driving circuit, which is used in a display device for a computer, comprising:
   a bipolar horizontal-deflection output transistor;
   a voltage source circuit whose negative terminal is connected to the base of said bipolar horizontal-deflection output transistor, said voltage circuit comprising a capacitor and a zener diode in which one end of said capacitor and an anode of said zener diode are connected with each other to constitute said negative terminal, and the other end of said capacitor serving as a positive terminal of said voltage source circuit;
   a current source circuit whose output terminal is connected to said positive terminal of said voltage source circuit, said current source circuit including a self bias circuit which has a transistor, a first resistor connected in series to the emitter of said transistor, a second resistor connected between a power source and the base of said transistor and a third resistor connected between the ground and the base of said transistor, said current source circuit having alternately activated and deactivated states controlled by said transistor;

an impedance element circuit having a first terminal connected to said positive terminal of the voltage source circuit and a second terminal connected to ground, said impedance element circuit comprising a FET and a fourth resistor connected in series with said FET, said impedance element circuit having alternately activated and deactivated states controlled by said FET; and a drive pulse supply circuit for controlling said transistor and FET to select the deactivated state of said impedance element circuit when said current source is in the activated state and to select the activated state of said impedance element circuit when said current source circuit is in the deactivated state.

2. A horizontal-deflection driving circuit in accordance with claim 1, wherein
said voltage source circuit further comprises a diode connected between the cathode of said zener diode and ground.

3. A horizontal-deflection driving circuit in accordance with claim 1, wherein
said zener diode is connected in parallel with said capacitor.

4. A horizontal-deflection driving circuit, which is used as a display device for a computer, comprising:
a bipolar horizontal-deflection output transistor;
a first voltage source circuit whose negative terminal is connected to the base of said bipolar horizontal-deflection output transistor, said first voltage source circuit comprising a first capacitor and a first zener diode in which one end of said first capacitor and an anode of said first zener diode are connected with each other to constitute said negative terminal, and the other end of said first capacitor serving as a positive terminal of said voltage source circuit;
a first current source circuit whose output terminal is connected to said positive terminal of said first voltage source circuit, said current source circuit including a self bias circuit which has a first transistor, a first resistor connected in series to the emitter of said first transistor, a second resistor connected between a power source and the base of said first transistor and a third resistor connected between ground and the base of said first transistor, said first current source circuit having alternately activated and deactivated states controlled by said first transistor;

a bipolar high voltage generation transistor;

a second voltage source circuit whose negative terminal is connected to a base of said bipolar high voltage generation transistor, said second voltage source circuit comprising a second capacitor and a second zener diode in which one end of said second capacitor and an anode of said second zener diode are connected with each other to constitute said negative terminal, and the other end of said second capacitor serves as a positive terminal;

a second current source circuit whose output terminal is connected to said positive terminal of said second voltage source circuit, said second current source circuit including a self bias circuit which has a second transistor, a fourth resistor connected in series to the emitter of said second transistor, a fifth resistor connected between a power source and the base of said second transistor and a sixth resistor connected between ground and the base of said second transistor, said second current source circuit having alternately activated and deactivated states controlled by said second transistor;

an impedance element circuit having a first and second terminal connected to said positive terminals of said first and second voltage source circuits, respectively and a third terminal connected to ground, said impedance element circuit comprising a FET and two resistors each connected in series with said FET; said impedance element circuit having alternatively activated and deactivated states controlled by FET; and a drive pulse supply circuit for controlling said first and second transistor and said FET for selecting the deactivated state of said impedance element circuit when said first and second current sources are in the activated state and for selecting the activated state of said impedance element circuit when said first and second current sources are in the deactivated state.

* * * * *